United States Patent
Takaoka et al.

(10) Patent No.: US 8,304,852 B2
(45) Date of Patent: Nov. 6, 2012

(54) SEMICONDUCTOR DEVICE

(75) Inventors: Hiromichi Takaoka, Kanagawa (JP);
Yoshitaka Kubota, Kanagawa (JP);
Hiroshi Tsuda, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 713 days.

(21) Appl. No.: 12/385,407

(22) Filed: Apr. 7, 2009

(65) Prior Publication Data

US 2009/0256235 A1  Oct. 15, 2009

(30) Foreign Application Priority Data

Apr. 14, 2008  (JP) .................................. 2008-104277

(51) Int. Cl.
*H01L 23/525*  (2006.01)
(52) U.S. Cl. ................. 257/529; 257/530; 257/E23.149
(58) Field of Classification Search .......... 257/520–530, 257/E23.149
See application file for complete search history.

(56) References Cited

U.S. PATENT DOCUMENTS

| 7,282,751 | B2 | 10/2007 | Ueda | |
| 2004/0262710 | A1 | 12/2004 | Ueda | |
| 2005/0029620 | A1* | 2/2005 | Ueda | 257/529 |
| 2007/0222029 | A1* | 9/2007 | Ueda | 257/529 |
| 2007/0262357 | A1* | 11/2007 | Ueda | 257/249 |
| 2007/0262414 | A1 | 11/2007 | Ueda | |

FOREIGN PATENT DOCUMENTS

| JP | 2005-39220 | 2/2005 |
| JP | 2005-57186 | 3/2005 |
| JP | 2006-253237 | 9/2006 |
| JP | 2007-305693 | 11/2007 |

* cited by examiner

*Primary Examiner* — Jarrett Stark
*Assistant Examiner* — Lawrence Tynes, Jr.
(74) *Attorney, Agent, or Firm* — McGinn IP Law Group, PLLC

(57) ABSTRACT

A semiconductor device (200) includes: an electrical fuse (100) including: a lower layer interconnect (120) formed on a substrate; a via (130) provided on the lower layer interconnect (120) so as to be connected to the lower layer interconnect (120); and an upper layer interconnect (110) provided on the via (130) so as to be connected to the via (130), the electrical fuse being cut, in a state after being cut, through formation of a flowing-out portion, the flowing-out portion being formed when an electrical conductor forming the upper layer interconnect (110) flows outside the upper layer interconnect (110); and a guard upper layer interconnect (152) (conductive heat-absorbing member) formed in at least the same layer as the upper layer interconnect (110), for absorbing heat generated in the upper layer interconnect (110).

16 Claims, 13 Drawing Sheets

SEMICONDUCTOR DEVICE

BACKGROUND OF THE INVENTION

1. Field of the Invention

The present invention relates to a semiconductor device, and more particularly, to a semiconductor device including an electrical fuse.

2. Description of the Related Art

Conventionally, there is known a technology in which a fuse is mounted on to a semiconductor device, whereby, for example, the electrical fuse is cut to adjust a value of a resistor used in the semiconductor device, or a defective element is separated and replaced by a normal element.

As a method of cutting a fuse, there is used a system of cutting the fuse by irradiating a part of the fuse with a laser beam, or a system of cutting the fuse through application of current.

JP 2005-39220 A, JP 2005-57186 A, and JP 2006-253237 A each disclose an electrical fuse which is cut with the use of a phenomenon in which a material forming the fuse migrates by electromigration.

JP 2005-39220 A discloses the fuse which is capable of being cut with a smaller current. In JP 2005-39220 A, an electrical conductor forming the fuse is formed in a shape in which the electrical conductor is folded back several times. Further, JP 2005-57186 A describes a structure in which lower and upper portions of a fuse melt down portion are covered with a plate, and side portions thereof are covered with via plugs.

JP 2006-253237 A describes a fuse element including a first interconnect, an insulating film formed above the first interconnect, a second interconnect formed above the insulating film, and a first via formed in the insulating film so as to connect the first interconnect and the second interconnect. In this case, a main portion of the first via is formed of a material which is more likely to cause the electromigration compared with main portions of the first interconnect and the second interconnect. JP 2006-253237 A also describes a structure in which heater wiring for heating the via is provided on the periphery of the via. Accordingly, it is intended that a temperature on the periphery of the via may be increased when the via is cut, whereby the via may be efficiently cut.

The present inventors have recognized as follows. As described in JP 2005-39220 A, JP 2005-57186 A, and JP 2006-253237 A, in a case where the fuse is cut with the use of the phenomenon in which the material forming the fuse migrates by the electromigration, for example, thermal treatment is performed on the semiconductor device after the fuse is cut, or the semiconductor device itself is exposed to heat generated in its actual use, whereby the material migrates. Accordingly, it is conceivable that reconnection may occur at a cutting point. If the reconnection as described above occurs, even when the electrical fuse to be cut is cut in advance, correct results cannot be obtained in a case of detecting whether or not the electrical fuse is cut. The fear that the reconnection as described above may occur is slight, and thus it is considered that no problem arises during normal operation. However, in a case where, for example, extremely high degree of reliability is required for the semiconductor device or the semiconductor device is used under extreme conditions, it is necessary to further enhance a retention characteristic that the cut electrical fuse maintains a state after cutting.

In order to solve the above-mentioned problems, in recent years, there is proposed a new method of cutting an electrical fuse, which is referred to as a crack assist type process, as described in JP 2007-305693 A (reference number: 74120620, Japanese Patent Application No. 2008-104277, and filing date: Apr. 14, 2008). In this method, for example, a structure of the electrical fuse and a voltage application method for the electrical fuse are controlled, whereby a part of the electrical conductor that forms the electrical fuse is forced to flow outside the electrical fuse, that is, flow into an insulating film provided on the periphery of the electrical conductor when the electrical fuse is cut. Then, a balance between a migration and a supply of a material is disturbed, to thereby form a cutting point with larger void in other part. As a result, a fear that the cut electrical fuse may be reconnected may be significantly reduced, and hence an excellent state after cutting may be maintained.

However, a flowing amount of the electrical conductor is increased in the electrical fuse cut by the above-mentioned method, and hence it is necessary to control a flowing portion of the electrical conductor and the migration of the flowing electrical conductor.

SUMMARY

According to the present invention, there is provided a semiconductor device including:
a substrate;
an electrical fuse including:
a lower layer interconnect formed on the substrate;
a via provided on the lower layer interconnect so as to be connected to the lower layer interconnect; and
an upper layer interconnect provided on the via so as to be connected to the via,
the electrical fuse being cut, in a state after being cut, through formation of a flowing-out portion, the flowing-out portion being formed when an electrical conductor forming the upper layer interconnect flows outside the upper layer interconnect; and
a conductive heat-absorbing member formed in at least the same layer as the upper layer interconnect, for absorbing heat generated in the upper layer interconnect.

Note that the electrical fuse according to the present invention may be cut in accordance with the following procedure.

A predetermined voltage is applied to both ends (lower layer interconnect side and upper layer interconnect side) of the electrical fuse, and a current is caused to flow through the electrical fuse. Then, self-heating of the current flowing through the electrical conductor forming the electrical fuse is utilized to expand the electrical conductor. The electrical conductor expands more compared with an insulating film located on the periphery thereof, with the result that a crack is formed in the insulating film, and the electrical conductor is caused to flow outside the upper layer interconnect so as to fill the crack. Moreover, an electrical conductor inside the via migrates toward the flowing-out portion outside, and thus a void is formed in the via portion, which causes cutoff. According to the study of the inventor(s) of the present invention, it is revealed that the flowing-out portion is more frequently formed below the upper layer interconnect when the electrical conductor forming the upper layer interconnect reaches excessively high temperature. In addition, it is revealed that the flowing-out portion formed below the upper layer interconnect may be electrically connected to the lower layer interconnect to cause a short circuit. As described above, the conductive heat-absorbing member is provided in the vicinity of the upper layer interconnect, to thereby suppress excessive heating which occurs in the upper layer interconnect at the time of cutting. Accordingly, it is possible to prevent the electrical conductor from flowing out unintentionally, which also leads to prevention of the short circuit which occurs in the electrical fuse after cutting.

According to the present invention, the state after cutting of the electrical fuse may be excellently maintained.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Figure 1:
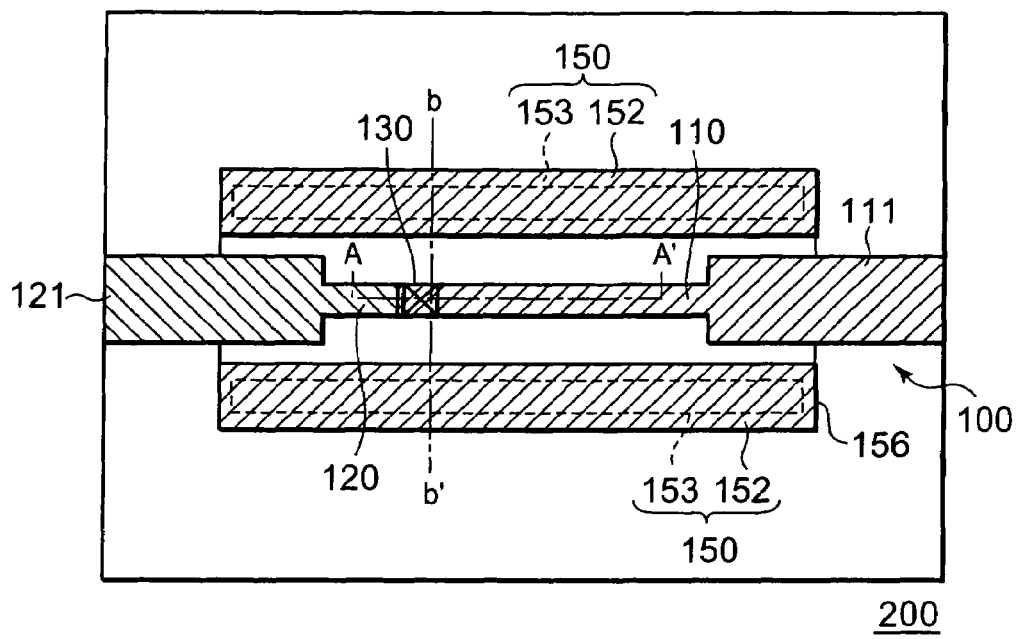
FIG. 1 is a schematic plan view illustrating an example of a structure of a semiconductor device including an electrical fuse according to an embodiment of the present invention.

In the following embodiment, similar components are denoted by like reference numerals, and descriptions thereof are omitted as appropriate.

In this embodiment, an electrical fuse is cut by a crack assist type process. The procedure for cutting the electrical fuse by the crack assist type process is as follows.

(1) Appropriate power is applied to the electrical fuse, and excessive amount of electrons are injected from, for example, an upper layer interconnect, whereby an interconnect and a via are heated.

(2) An electrical conductor forming the heated interconnect and via expands, and thus cracks occur in a peripheral insulating film and a barrier metal film. In this case, the cracks occur in a periphery of the interconnect having a larger area in an in-plane direction of a semiconductor substrate (that is, interconnect having a larger volume).

(3) The electrical conductor flows into the cracks of the insulating film and the barrier metal film, thereby reducing a density of the electrical conductor forming the electrical fuse.

(4) Correspondingly, the electrical conductor located in a via portion having a smaller area in an in-plane direction (that is, via portion having a smaller volume) of the semiconductor substrate is absorbed in a direction in which the electrical conductor has flown out so as to compensate the reduced density. Accordingly, a cutting point occurs in the via portion, and then the electrical fuse is cut.

Figure 11A:
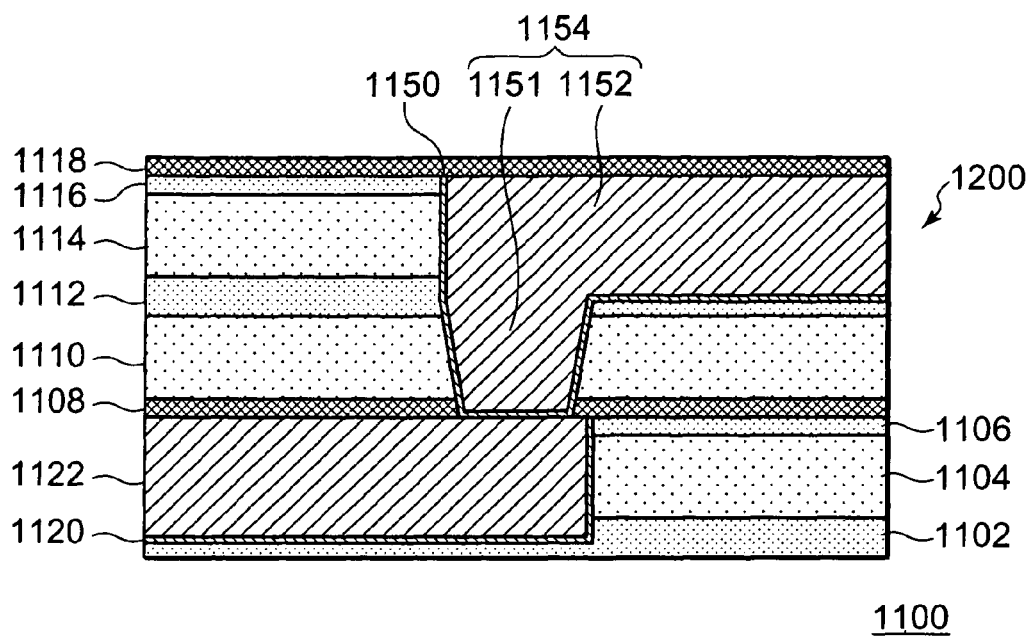
FIGS. 11A and 11B are cross-sectional views for describing an operation when the electrical fuse is cut by a crack assist type process.
Figure 11B:
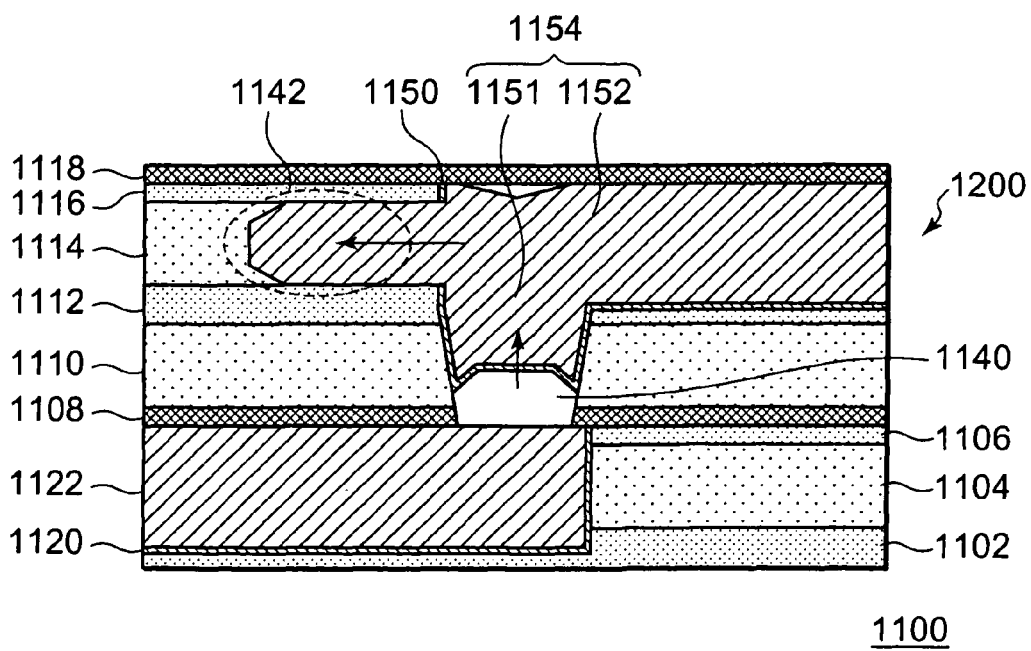

With reference to FIGS. 11A and 11B, an operation in the case of cutting the electrical fuse by the crack assist type process is described. FIGS. 11A and 11B are cross-sectional views illustrating a structure of a semiconductor device 1100 including an electrical fuse 1200. FIG. 11A and FIG. 11B illustrate a state before the electrical fuse 1200 is cut and a state after the electrical fuse 1200 is cut, respectively. Here, an example in which an interconnect structure is a dual damascene structure is illustrated.

The semiconductor device 1100 includes a semiconductor substrate (not shown), and an etch stop film 1102, an interlayer insulating film 1104, a protective film 1106, an etch stop film 1108, an interlayer insulating film 1110, an etch stop film 1112, an interlayer insulating film 1114, a protective film 1116, and an etch stop film 1118 which are formed on the semiconductor substrate in the stated order.

As illustrated in FIG. 11A, in the state before cutting, the electrical fuse 1200 includes a lower layer interconnect 1122, and a via 1151 and an upper layer interconnect 1152 which are formed on the lower layer interconnect 1122. Here, the via 1151 and the upper layer interconnect 1152 are integrally formed as a dual damascene interconnect 1154.

The lower layer interconnect 1122 is formed in the etch stop film 1102, the interlayer insulating film 1104, and the protective film 1106. The via 1151 is formed in the etch stop film 1108, the interlayer insulating film 1110, and the etch stop film 1112. The upper layer interconnect 1152 is formed in the etch stop film 1112, the interlayer insulating film 1114, and the protective film 1116.

The lower layer interconnect 1122, the via 1151, and the upper layer interconnect 1152 are formed of an electrical conductor such as copper-containing metallic film which contains copper as a main component. The copper-containing metallic film may contain silver. Further, the copper-containing metallic film may have a composition containing one or more different elements selected from the group consisting of Al, Au, Pt, Cr, Mo, W, Mg, Be, Zn, Pd, Cd, Hg, Si, Zr, Ti, and Sn. The copper-containing metallic film may be formed by, for example, a plating method. Further, a surface of the copper-containing metallic film may be provided with, for example, a silicide film formed thereon.

Further, a barrier metal film 1120, which is formed so as to be brought into contact with and cover the lower layer interconnect 1122, is provided on a side surface and a bottom surface of the lower layer interconnect 1122. A barrier metal film 1150, which is formed so as to be brought into contact with and cover the dual damascene interconnect 1154, is formed on a side surface and a bottom surface of the dual damascene interconnect 1154. The barrier metal film may be configured to include refractory metal. The barrier metal film may be formed of, for example, Ta, TaN, Ti, TiN, W, WN, or the like.

In other words, in the state before cutting, the barrier metal film 1150 is provided between the lower layer interconnect 1122 and the via 1151 so as to be brought into contact therewith.

The interlayer insulating film 1104 and the interlayer insulating film 1114 may be formed of a low dielectric constant film such as SiOC. The interlayer insulating film 1104 and the interlayer insulating film 1114 may be formed of the same material or different materials.

Further, the interlayer insulating film 1110 may be formed of a material similar to the above-mentioned materials for the interlayer insulating film 1104 and the interlayer insulating film 1114.

Also in this case, the structure is made so that a crack is likely to occur selectively in a portion of the interconnect because an area of the via 1151 in an in-plane direction of the semiconductor substrate is extremely smaller than that of the interconnect.

The etch stop film 1108 and the etch stop film 1118 function as etch stop films when a via hole or an interconnect groove is formed, and also function to prevent diffusion of copper forming the lower layer interconnect 1122 and the upper layer interconnect 1152. In addition, in this embodiment, the etch stop film 1108 and the etch stop film 1118 function as a coating film for the electrical fuse 1200. The etch stop film 1108 and the etch stop film 1118 may be formed of a material which is harder than materials of the interlayer insulating film 1104 and the interlayer insulating film 1114. The etch stop film 1108 and the etch stop film 1118 may be formed of a material having a higher Young's modulus compared with the interlayer insulating film 1104 and the interlayer insulating film 1114. The etch stop film 1108 and the etch stop film 1118 may be formed of, for example, SiCN, SiN, SiC, SiOF, SiON, or the like.

The protective film 1106 and the protective film 1116 have a function of protecting the interlayer insulating film 1104 and the interlayer insulating film 1114 when the lower layer interconnect 1122 and the upper layer interconnect 1152 are each polished by chemical mechanical polishing (CMP). The protective film 1106 and the protective film 1116 may be formed of, for example, an $SiO_2$ film.

The etch stop film 1102 and the etch stop film 1112 may be formed of, for example, materials similar to those of the etch stop film 1108 and the etch stop film 1118. Further, the etch stop film 1102 and the etch stop film 1112 may be formed of a laminated film (not shown) formed of a first insulating film and a second insulating film. The first insulating film is formed of a material similar to the materials of the etch stop film 1108 and the etch stop film 1118, and the second insulating film is formed on the first insulating film and formed of a material similar to the materials of the protective film 1106 and the protective film 1116.

Note that the lower layer interconnect 1122, the via 1151, the upper layer interconnect 1152, and the like which have the above-mentioned structure may be formed in the steps which are similar to those for an ordinary multilayer interconnect structure. Accordingly, the electrical fuse 1200 may be formed without an additional special step.

As described above, for example, there may be provided a structure in which a periphery of the dual damascene interconnect 1154 is covered with coating films such as the barrier metal film 1150 and the etch stop film 1118, and the interlayer insulating film 1114 which is made of a softer material than the coating films is further formed in a periphery thereof. The upper layer interconnect 1152 is formed so as to have a larger area in the in-plane direction of the semiconductor substrate compared with the via 1151 and the lower layer interconnect 1122.

Next, a procedure for cutting the electrical fuse 1200 having the above-mentioned structure is described.

A predetermined voltage is applied between the upper layer interconnect 1152 and the lower layer interconnect 1122 to apply appropriate power to the electrical fuse 1200, whereby the electrical conductor forming the upper layer interconnect 1152 of the electrical fuse 1200 expands. Along with the expansion of the electrical conductor, a crack occurs in the barrier metal film 1150, the etch stop film 1118, and the like, and thus the electrical conductor forming the upper layer interconnect 1152 flows into a peripheral film from the crack. Specifically, the electrical conductor forming the upper layer interconnect 1152 flows outside an interconnect groove. Accordingly, a flowing-out portion 1142 is formed as illustrated in FIG. 11B.

Further, the electrical conductor migrates abruptly in a direction of the flowing-out portion 1142, whereby the electrical conductor is cut at a point at which the migration of the electrical conductor has not kept up with migrated electrical conductor. In this embodiment, the electrical conductor is cut at the portion of the via 1151, whereby a void portion 1140 is formed. Through the mechanism as described above, the large void portion 1140 is formed at a point which is apart from the flowing-out portion 1142 by a certain distance.

Moreover, the barrier metal film 1150 is provided between the via 1151 and the lower layer interconnect 1122 in this embodiment, and hence the barrier metal film 1150 is likely to be peeled off from the lower layer interconnect 1122. Accordingly, the void portion 1140 is more likely to be formed between the barrier metal film 1150 and the lower layer interconnect 1122.

Further, in the state after cutting, the electrical conductor forming the via 1151 migrates together with the barrier metal film 1150, whereby the void portion 1140 is formed between the barrier metal film 1150 and the lower layer interconnect 1122. For this reason, even when thermal treatment or the like is performed in the subsequent step, the barrier metal film 1150 and the electrical conductor formed of the copper-containing metallic film may be prevented from reconnecting with the lower layer interconnect 1122 by migrating again. As a result, thermal resistance of the semiconductor device 1100 may be improved.

The electrical fuse 1200 is cut by the crack assist type process with the mechanism as described above, whereby the void portion 1140 is necessarily formed in a region different from that of the flowing-out portion 1142. As a result, the reconnection of the electrical fuse 1200 may be prevented.

As described above, the control may be made so that, for example, a crack is caused to occur more easily in the periphery of the upper layer interconnect by making the area of the upper layer interconnect larger than that of the lower layer interconnect so as to cause the electrical conductor forming the upper layer interconnect to flow out. However, it has been difficult to control a point in the upper layer interconnect, a direction, and an extent of an amount regarding the electrical conductor to be caused to flow out.

The inventors of the present invention have extensively studied a mechanism in which the electrical conductor forming the electrical fuse flows out in cutting the electrical fuse having the structure as described above by the crack assist type process. FIGS. 12A to 12C and FIGS. 13A to 13C are cross-sectional views schematically illustrating the mechanism. Here, FIGS. 12A to 12C and FIGS. 13A to 13C illustrate an interlayer insulating film 1119 formed on the upper layer interconnect 1152, in addition to the structure illustrated in FIGS. 11A and 11B. Note that the etch stop film 1118 as illustrated in FIGS. 11A and 11B exists between the upper layer interconnect 1152 and the interlayer insulating film 1119, but description thereof is omitted here. In addition, description of the barrier metal film, the etch stop film, and the protective film is partly omitted here.

Figure 12A:
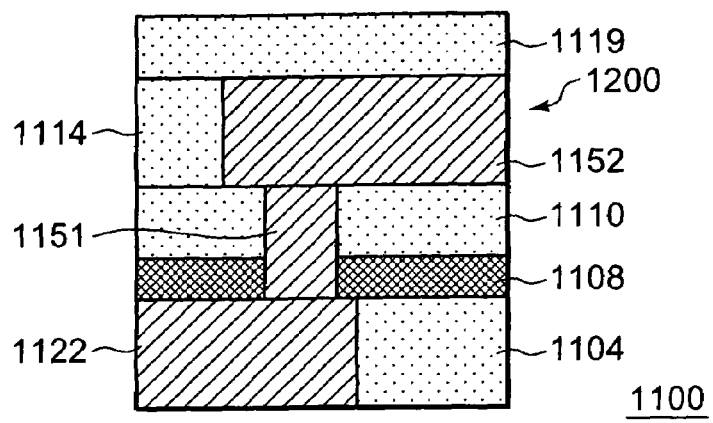
FIGS. 12A to 12C are other cross-sectional views for describing the operation when the electrical fuse is cut by the crack assist type process.
Figure 12B:
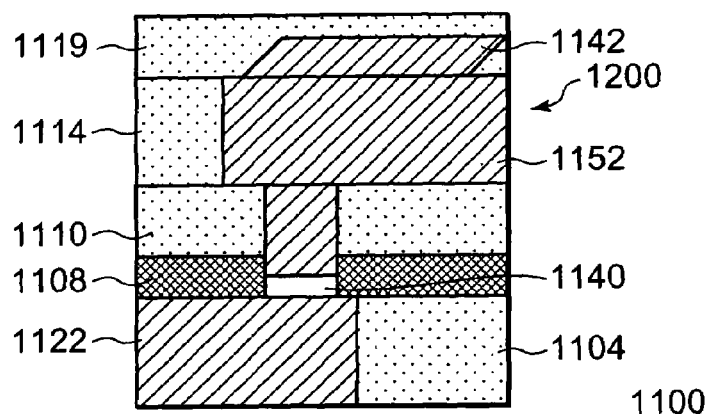
Figure 12C:
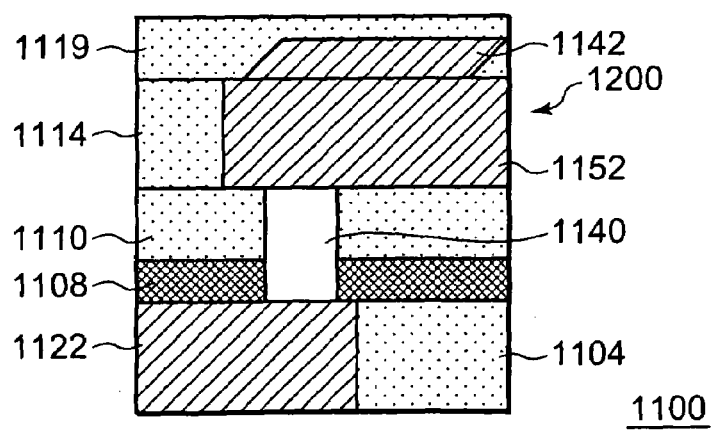

FIG. 12A illustrates a state before cutting. When a predetermined voltage is applied between the upper layer interconnect 1152 and the lower layer interconnect 1122 to apply appropriate power to the electrical fuse 1200 in such a state, the upper layer interconnect 1152 expands, where by a crack occurs in the periphery thereof. FIGS. 11A and 11B illustrate an example in which the electrical conductor flows into the interlayer insulating film 1114. However, as illustrated in FIG. 12B, it is revealed that the electrical conductor is more likely to flow into the interlayer insulating film 1119 formed on the upper layer interconnect 1152. For this reason, the flowing-out portion 1142 is formed in the interlayer insulating film 1119. The electrical conductor migrates abruptly in the direction of the flowing-out portion 1142 (FIG. 12C), and hence the electrical conductor is cut at the portion of the via 1151, to thereby form the void portion 1140.

Figure 13A:
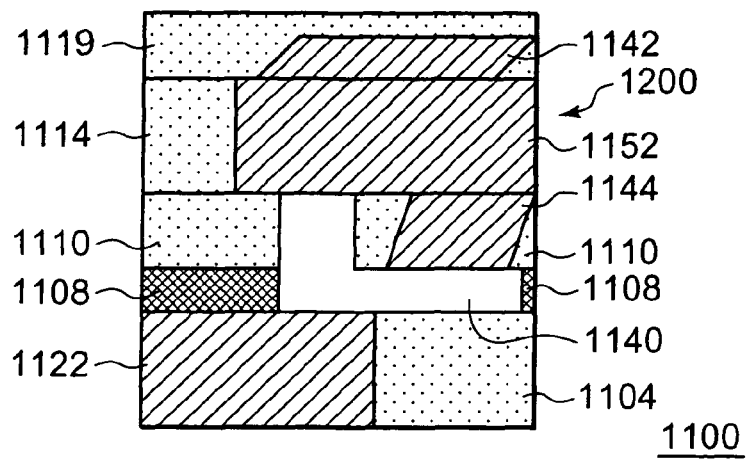
FIGS. 13A to 13C are still other cross-sectional views for describing the operation when the electrical fuse is cut by the crack assist type process.
Figure 13B:
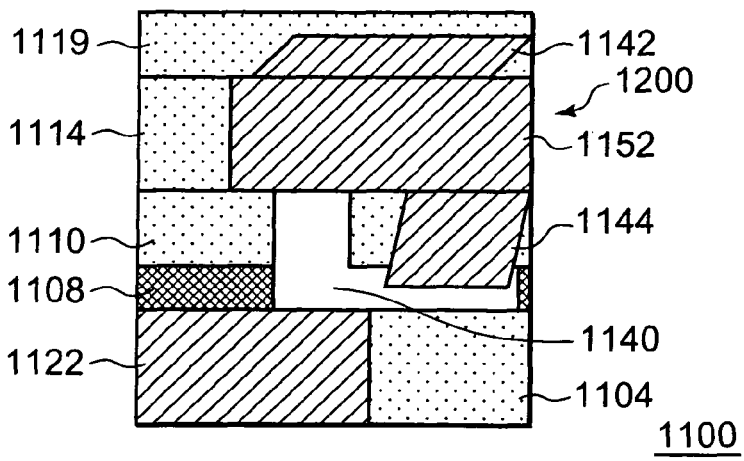
Figure 13C:
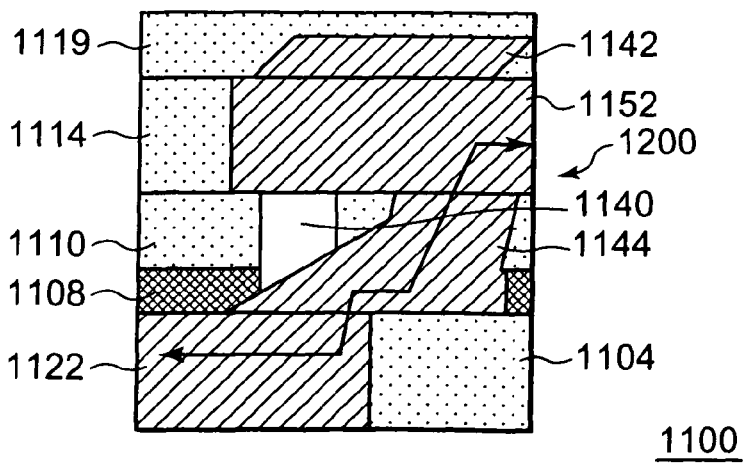

However, it is revealed that in some cases, when the upper layer interconnect 1152 is excessively heated and expands, the electrical conductor flows not only above the upper layer interconnect 1152 but also into the interlayer insulating film 1110 formed below the upper layer interconnect 1152 to form a second flowing-out portion 1144. In addition, it is revealed that in some cases, the etch stop film 1108 located on a side of the via 1151 is lost (FIG. 13A). When a thermal stress is applied in this state, in some cases, the second flowing-out portion 1144 spreads up to a portion in which the etch stop film 1108 is lost to connect the second flowing-out portion 1144 with the lower layer interconnect 1122 (FIG. 13B and FIG. 13C) Particularly, it is also revealed that the etch stop film 1108 is likely to be lost in the case where the etch stop film 1108 is formed of an insulating film containing carbon and Si such as SiCN. When this happens, a new path (See arrowed line of FIG. 13C) is formed between the upper layer interconnect 1152 and the lower layer interconnect 1122. Accordingly, the electrical fuse 1200 which is supposed to be cut and have higher resistance becomes the state of being connected, and thus have lower resistance. As a result, the cut state of the electrical fuse cannot be determined accurately.

After the study regarding a cause for this, the inventors of the present invention have found that the electrical conductor forming the upper layer interconnect 1152 reaches excessively high temperature when being cut, whereby, for example, the etch stop film 1108 is lost, or the second flowing-out portion 1144 as described above unfavorably occurs by flowing out from the upper layer interconnect 1152. Moreover, the inventor(s) of the present invention have found that due to a thermal stress applied in this state, a short circuit occurs between the upper layer interconnect 1152 and the lower layer interconnect 1122 of the electrical fuse 1200 which has been cut. The inventor(s) of the present invention have aimed to control temperature rise of the upper layer interconnect 1152, which is a cause for the short circuit as described above, to thereby reach the present invention.

In this embodiment, the semiconductor device includes an electrical fuse including a lower layer interconnect, a via provided on the lower layer interconnect so as to be brought into contact therewith, and an upper layer interconnect provided on the via so as to be brought into contact therewith as in the case of the electrical fuse 1200, and a conductive heat-absorbing member which is formed in at least the same layer as the upper layer interconnect and absorbs heat generated in the upper layer interconnect. The provision of the conductive heat-absorbing member as described above enables to prevent the second flowing-out portion 1144 as described above from being generated to prevent the electrical fuse after being cut from reducing its resistance.

Figure 2:
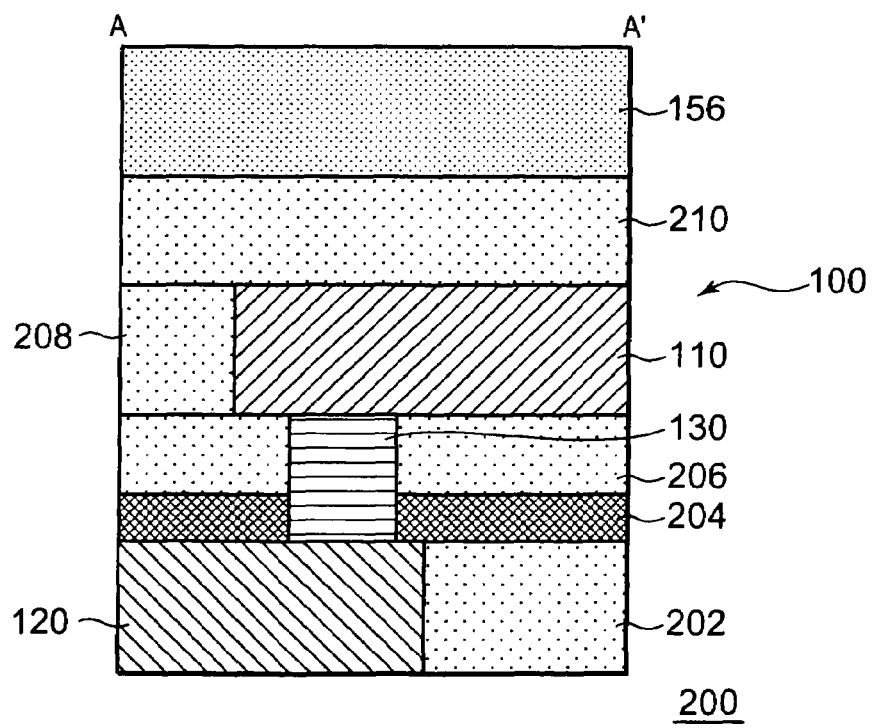
FIG. 2 is a cross-sectional view of FIG. 1.
Figure 3:
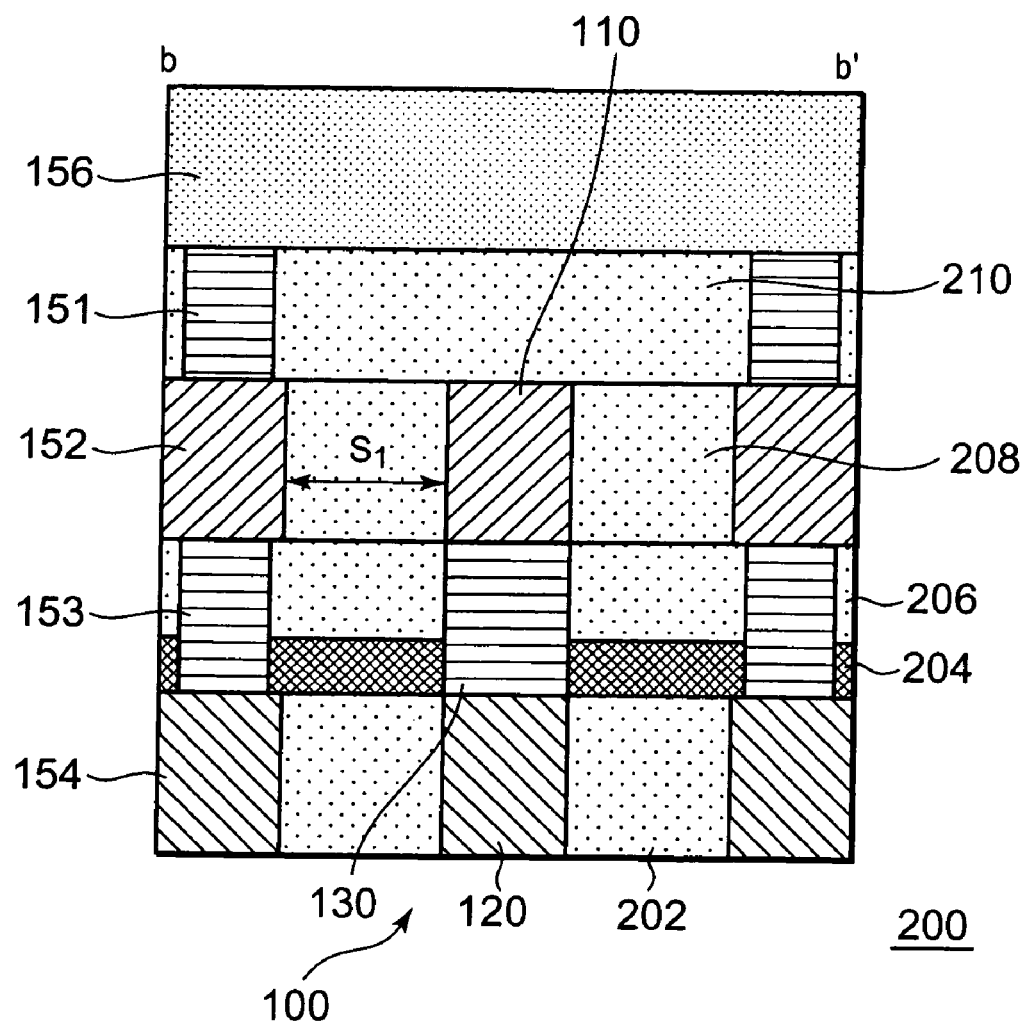
FIG. 3 is another cross-sectional view of FIG. 1.

Hereinafter, a structure of a semiconductor device 200 according to this embodiment is described. The semiconductor device 200 includes an electrical fuse 100 formed on a semiconductor substrate (substrate, not shown) such as a silicon substrate. FIG. 1 is a schematic plan view illustrating an example of a structure of the electrical fuse 100 according to this embodiment. FIG. 2 and FIG. 3 are cross-sectional views of FIG. 1. FIG. 2 is the cross-sectional view taken along the line A-A' of FIG. 1, and FIG. 3 is the cross-sectional view taken along the line b-b' of FIG. 1.

The electrical fuse 100 includes an upper layer interconnect 110, a lower layer interconnect 120, and a via 130 for connecting the upper layer interconnect 110 and the lower layer interconnect 120. In this embodiment, the semiconductor device 200 may have a structure similar to that of the electrical fuse 1200 described with reference to FIGS. 11A and 11B. For example, the lower layer interconnect 120, the via 130, and the upper layer interconnect 110 may have structures similar to those of the lower layer interconnect 1122, the via 1151, and the upper layer interconnect 1152, respectively. Specifically, the lower layer interconnect 120, the via 130, and the upper layer interconnect 110 may be formed of the copper-containing metallic film. In addition, though not illustrated here, side surfaces and bottom surfaces of the lower layer interconnect 120, the via 130, and the upper layer interconnect 110 may be provided with a barrier metal film which is similar as that for the barrier metal film 1120 and the barrier metal film 1150.

Further, in this embodiment, control is made so that the upper layer interconnect 110 expands more than the lower layer interconnect 120 to cause flowing-out of the electrical conductor in the upper layer interconnect 110. Accordingly, the upper layer interconnect 110 is provided so as to have a larger volume than the lower layer interconnect 120. For example, in a portion in which the upper layer interconnect 110 and the lower layer interconnect 120 are each connected to the via 130, and which is narrower than other portions, the upper layer interconnect 110 may be set longer than the lower layer interconnect 120. Note that the above-mentioned structure is an example, and any structure is possible as long as the upper layer interconnect 110 is more likely to expand than the lower layer interconnect 120. Accordingly, in cutting the electrical fuse 100, a crack may be caused to occur easily in a periphery of the upper layer interconnect 110. Note that the upper layer interconnect 110 is connected to an upper layer terminal 111 formed in the same layer as itself, and the lower layer interconnect 120 is connected to a lower layer terminal 121 formed in the same layer as itself. The upper layer terminal 111 and the lower layer terminal 121 may also be formed of the same materials as the upper layer interconnect 110 and the lower layer interconnect 120, respectively.

Further, in this embodiment, the electrical fuse 100 is provided in the semiconductor device 200. The semiconductor device 200 has a structure in which an interlayer insulating film 202, an etch stop film 204, an interlayer insulating film 206, an interlayer insulating film 208, and an interlayer insulating film 210 are laminated in the stated order. In this case, a protective film and an etching film are partially omitted, and a laminated film thereof may be the same as the laminated film described with reference to FIGS. 11A and 11B.

The lower layer interconnect 120 is provided in the interlayer insulating film 202. The via 130 is provided in the etch stop film 204 and the interlayer insulating film 206. The upper layer interconnect 110 is provided in the interlayer insulating film 208. In this case, the via 130 and the upper layer interconnect 110 are illustrated separately from each other, but may have the dual damascene structure similarly to the dual damascene interconnect 1154 illustrated in FIGS. 11A and 11B.

This embodiment is different from the example illustrated in FIGS. 11A and 11B in that a guard portion 150 is provided in a periphery of the electrical fuse 100. In this embodiment, the guard portion 150 functions as the conductive heat-absorbing member. The guard portion 150 includes a guard lower layer interconnect 154 provided in the same layer as the lower layer interconnect 120, a guard lower layer via 153 provided in the same layer as the via 130, a guard upper layer interconnect 152 provided in the same layer as the upper layer interconnect 110, a guard upper layer via 151 provided on the upper side of the guard upper layer interconnect 152, and an upper plate 156 provided on the upper side of the guard upper layer via 151. In this embodiment, the guard portion 150 may be formed in a floating state so as not to be electrically connected to other element or the like. Note that in this embodiment, the guard portion 150 is linearly provided in plan view. In addition, the guard portion 150 is provided substantially in parallel with the upper layer interconnect 110 in this embodiment.

The guard portion 150 has two combinations of the laminated structures including the guard upper layer via 151, the guard upper layer interconnect 152, the guard lower layer via 153, and the guard lower layer interconnect 154, and the combinations are each placed on both sides of the electrical fuse 100. The guard upper layer interconnect 152, the guard lower layer via 153, and the guard lower layer interconnect 154 of the guard portion 150, which are laminated on each other, are formed continuously through the layer in which the upper layer interconnect 110 is formed, the layer in which the via 130 is formed, and the layer in which the lower layer interconnect 120 is formed. Further, in this embodiment, the guard upper layer interconnect 152, the guard lower layer via 153, and the guard lower layer interconnect 154 of the guard portion 150, which are laminated on each other, are formed in the same shape in plan view.

Here, in the layer in which the upper layer interconnect 110 is formed, a distance S1 between the upper layer interconnect 110 and the guard upper layer interconnect 152 serving as the conductive heat-absorbing member may be preferably set to be equal to or smaller than six times a via diameter of the via 130 (diameter of the via) Here, the distance S1 between the upper layer interconnect 110 and the guard upper layer interconnect 152 serving as the conductive heat-absorbing member may be set to a distance in a direction perpendicular to an extending direction of the upper layer interconnect 110 and the guard upper layer interconnect 152 which are provided substantially parallel to each other. More preferably, in the layer in which the upper layer interconnect 110 is formed, the distance S1 between the upper layer interconnect 110 and the guard upper layer interconnect 152 serving as the conductive heat-absorbing member may be set to be equal to or smaller than four times the via diameter of the via 130. Here, regarding sizes such as the via diameter and the distance between the upper layer interconnect 110 and the guard upper layer interconnect 152, a designed value may be set as a reference for each thereof. The via diameter varies in accordance with a generation of a process to be applied or the like, and the via diameter of the via 130 may be set to be, for example, about 90 nm in this embodiment. Note that in this embodiment, the via diameter of the via 130 may be made to be substantially equal to an interconnect width of the upper layer interconnect 110. Specifically, in this embodiment, the distance S1 between the upper layer interconnect 110 and the guard upper layer interconnect 152 serving as the conductive heat-absorbing member may be preferably set to be equal to or smaller than six times, and more preferably, equal to or smaller than four times the width of the upper layer interconnect 110. The guard upper layer interconnect 152 is provided at a position closer to the upper layer interconnect 110 by such a distance as described above. As a result, when the electrical fuse 100 is cut, the guard upper layer interconnect 152 functions as a heat sink and absorbs heat generated in the upper layer interconnect 110, to thereby prevent an excessive temperature rise of the upper layer interconnect 110. Accordingly, generation of the second flowing-out portion 1144 as described above may be avoided to prevent the electrical fuse after being cut from having a lower resistance.

Figure 4:
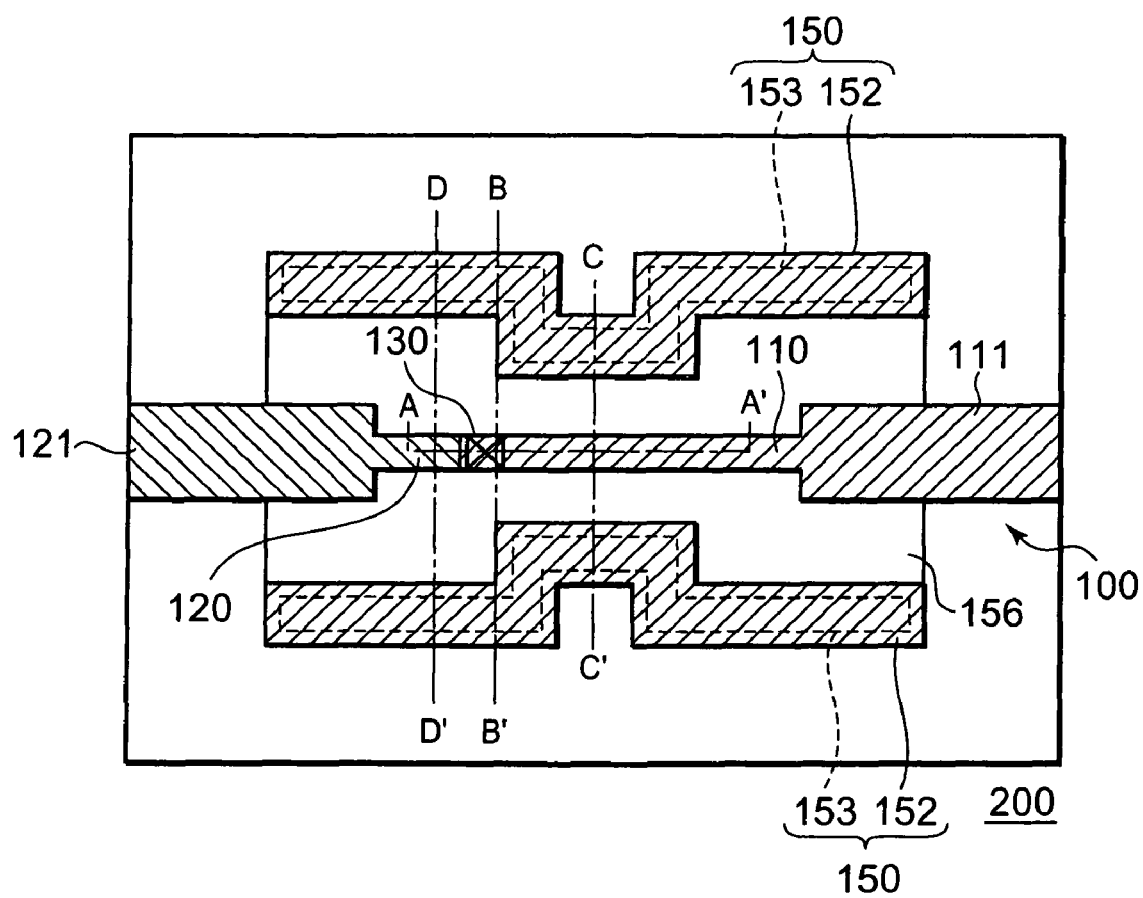
FIG. 4 is a schematic plan view illustrating another example of the structure of the semiconductor device including the electrical fuse according to the embodiment of the present invention.
Figure 5:
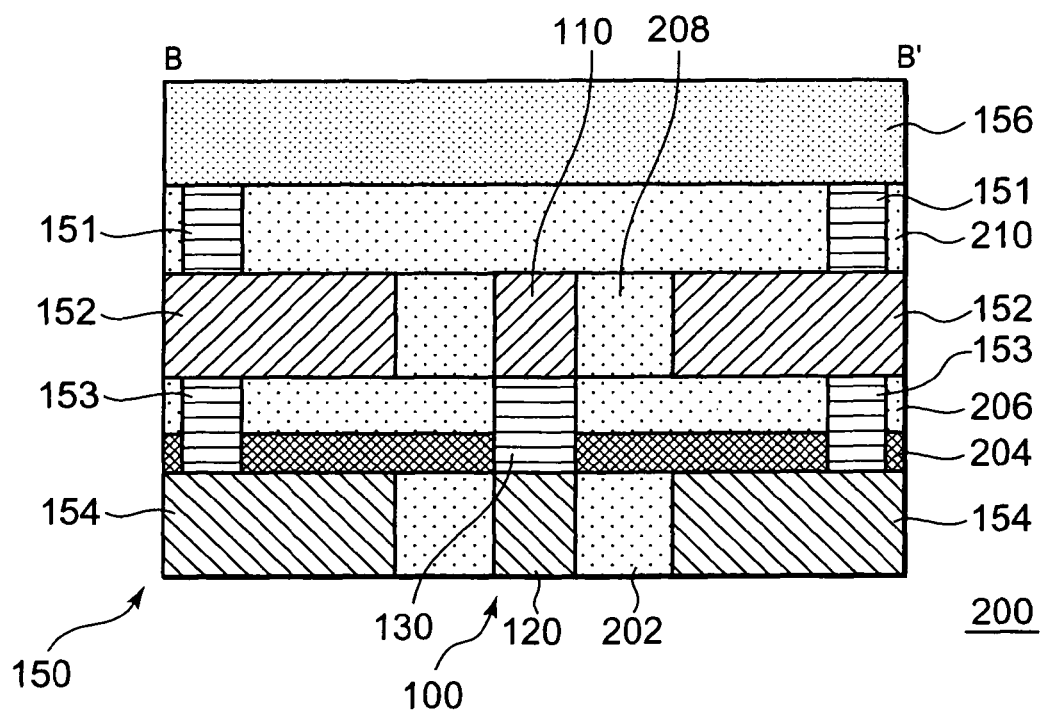
FIG. 5 is a cross-sectional view of FIG. 4.
Figure 6A:
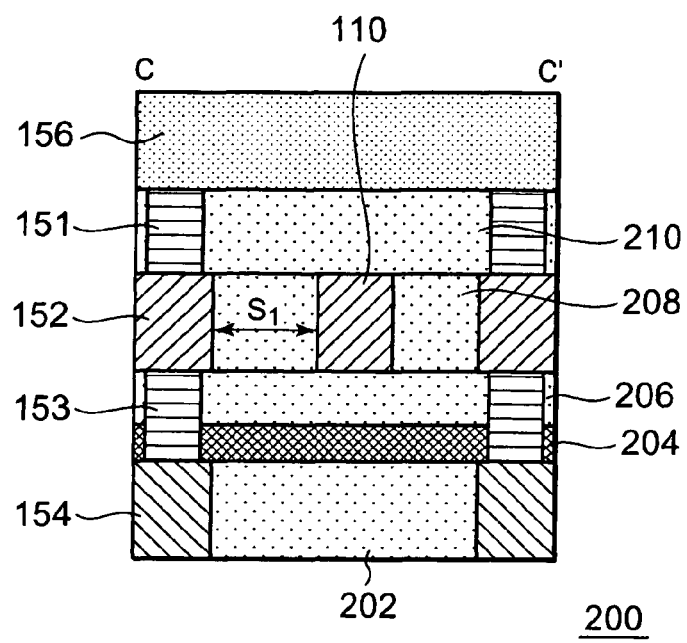
FIGS. 6A and 6B are another cross-sectional view and still another cross-sectional view of FIG. 4.
Figure 6B:
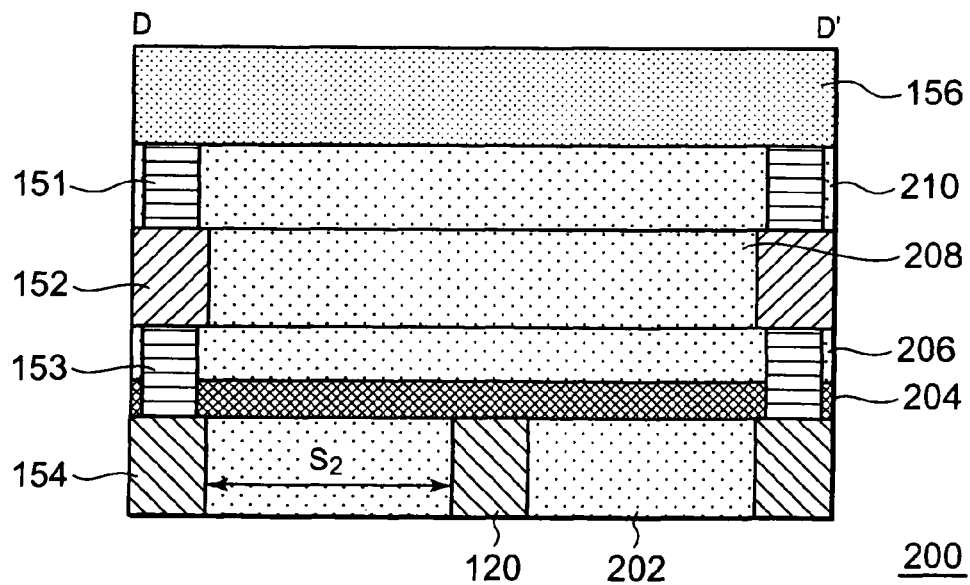

FIG. 4 is a schematic plan view illustrating another example of the structure of the semiconductor device including the electrical fuse 100 according to this embodiment of the present invention. FIG. 5 and FIGS. 6A and 6B are cross-sectional views of FIG. 4. The cross-sectional view taken along the line A-A' of FIG. 4 is similar to that of FIG. 2. FIG. 5 is the cross-sectional view taken along the line B-B' of FIG. 4. FIG. 6A corresponds to the cross-sectional view taken along the line C-C' of FIG. 4, and FIG. 6B corresponds to the cross-sectional view taken along the line D-D' of FIG. 4.

Figure 7:
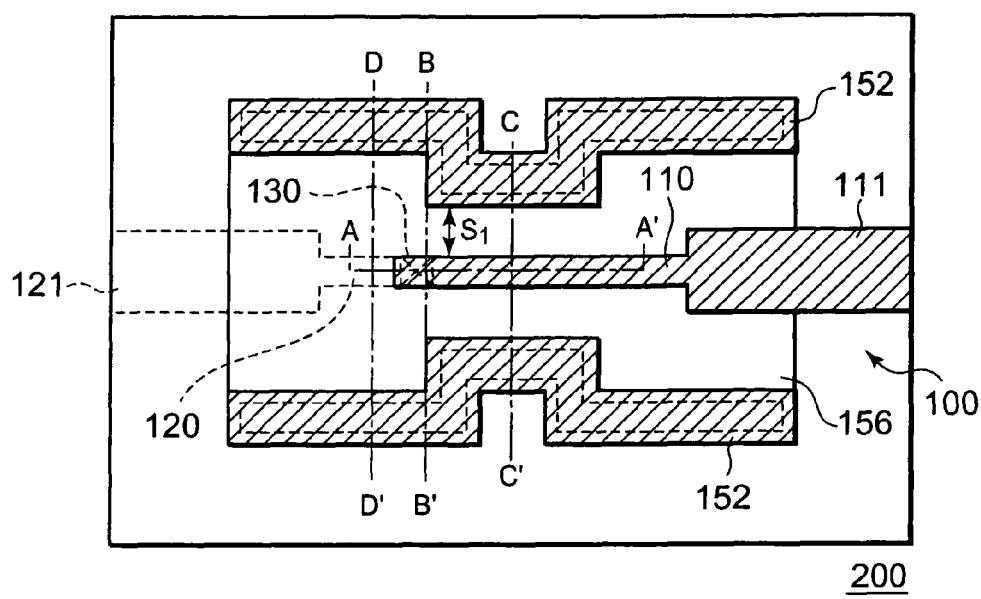
FIG. 7 is a plan view illustrating a structure of respective layers.
Figure 8:
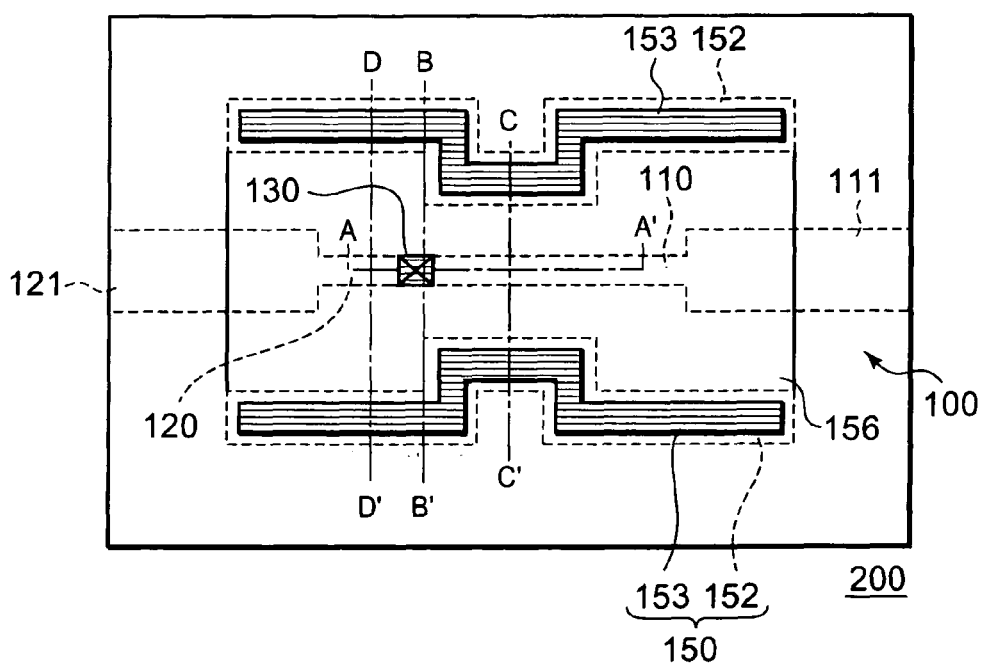
FIG. 8 is another plan view illustrating the structure of the respective layers.
Figure 9:
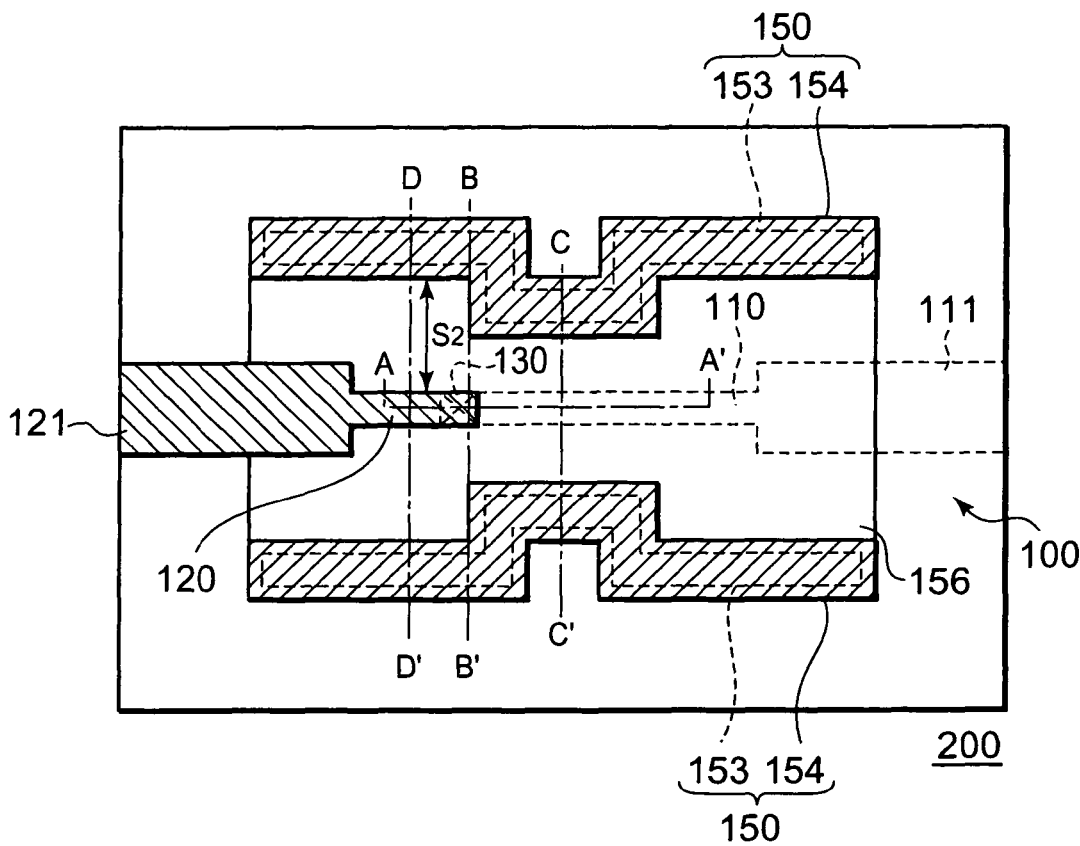
FIG. 9 is still another plan view illustrating the structure of the respective layers.

FIG. 7 is a plan view illustrating a structure of a layer in which the upper layer interconnect 110 is formed. FIG. 8 is a plan view illustrating a structure in which the via 130 is formed. FIG. 9 is a plan view illustrating a structure of a layer in which the lower layer interconnect 120 is formed.

Also in this example, the guard upper layer interconnect 152, the guard lower layer via 153, and the guard lower layer interconnect 154 of the guard portion 150, which are laminated on each other, are formed in the same shape in plan view. Moreover, also in this example, the guard portion 150 is provided substantially in parallel with the upper layer interconnect 110 in a region in a vicinity of the point at which the upper layer interconnect 110 and the via 130 are connected to each other.

Also in this case, the distance between the upper layer interconnect 110 and the guard upper layer interconnect 152 serving as the conductive heat-absorbing member may be preferably set to be equal to or smaller than six times the via diameter of the via 130 in a layer in which the upper layer interconnect 110 is formed, which is illustrated in FIG. 7. Here, the distance S1 between the upper layer interconnect 110 and the guard upper layer interconnect 152 serving as the conductive heat-absorbing member may be, in the region in the vicinity of the point at which the upper layer interconnect 110 and the via 130 are connected to each other, set to a distance in a direction perpendicular to the extending direction of the upper layer interconnect 110 and the guard upper layer interconnect 152 which is provided substantially in parallel with the upper layer interconnect 110. More preferably, in the layer in which the upper layer interconnect 110 is formed, the distance between the upper layer interconnect 110 and the guard upper layer interconnect 152 serving as the conductive heat-absorbing member may be made to be equal to or smaller than four times the via diameter of the via 130. The guard upper layer interconnect 152 is provided at a position closer to the upper layer interconnect 110 by such a distance as described above. As a result, also when the electrical fuse 100 is cut, the guard upper layer interconnect 152 functions as the heat sink and absorbs the heat generated in the upper layer interconnect 110, to thereby prevent an excessive temperature rise of the upper layer interconnect 110. Accordingly, the generation of the second flowing-out portion 1144 as described above may be avoided to prevent the electrical fuse after being cut from having a lower resistance.

Note that in this embodiment, the guard portion 150 is in a floating state, whereby the resistance of the electrical fuse 100 does not change even when the upper layer interconnect 110 is brought into contact with the guard portion 150, which does not affect the determination of the cut state of the electrical fuse 100. On the other hand, when the upper layer interconnect 110 and the lower layer interconnect 120 are each brought into contact with the guard portion 150 after the electrical fuse 100 is cut, the upper layer interconnect 110 and the lower layer interconnect 120 are electrically connected to each other through the guard portion 150. Therefore, there is a fear that the cut state of the electrical fuse 100 may be erroneously determined.

In this embodiment, the distance between the guard upper layer interconnect 152 serving as the conductive heat-absorbing member and the upper layer interconnect 110 in the layer in which the upper layer interconnect 110 is formed is narrower than a distance between the guard lower layer interconnect 154 serving as the conductive heat-absorbing member and the lower layer interconnect 120 in the layer in which the lower layer interconnect 120 is formed.

As illustrated in FIG. 7 and FIG. 9, the upper layer interconnect 110 and the lower layer interconnect 120 are placed so as not to overlap each other in a portion other than the point at which the upper layer interconnect 110 and the lower layer interconnect 120 are connected to each other through the via 130 in plan view. The two guard portions 150 are placed on both sides of the electrical fuse 100 formed substantially linearly in plan view so as to sandwich the electrical fuse 100 therebetween. In this embodiment, the two guards portions 150 are not formed linearly and have a curved shape in the portion in which the upper layer interconnect 110 is formed in plan view so as to be placed at a position closer to the electrical fuse 100 than other regions. As illustrated in FIGS. 6A and 6B, FIG. 7, and FIG. 9, the distance S1 between the upper layer interconnect 110 and the guard upper layer interconnect 152 is narrower than a distance S2 between the lower layer interconnect 120 and the guard lower layer interconnect 154.

With the structure as described above, the guard upper layer interconnect 152 is placed in the vicinity of the upper layer interconnect 110 and is caused to function as the heat sink for the upper layer interconnect 110, and the distance between the lower layer interconnect 120 and the guard lower layer interconnect 154 is made large. As a result, the lower layer interconnect 120 may be prevented from being brought into contact with the guard lower layer interconnect 154 even when a crack occurs in the lower layer interconnect 120 and the electrical conductor forming the lower layer interconnect 120 flows out. Accordingly, a short circuit may be prevented from occurring between the upper layer interconnect 110 and the lower layer interconnect 120 via the guard portion 150.

Figure 10:
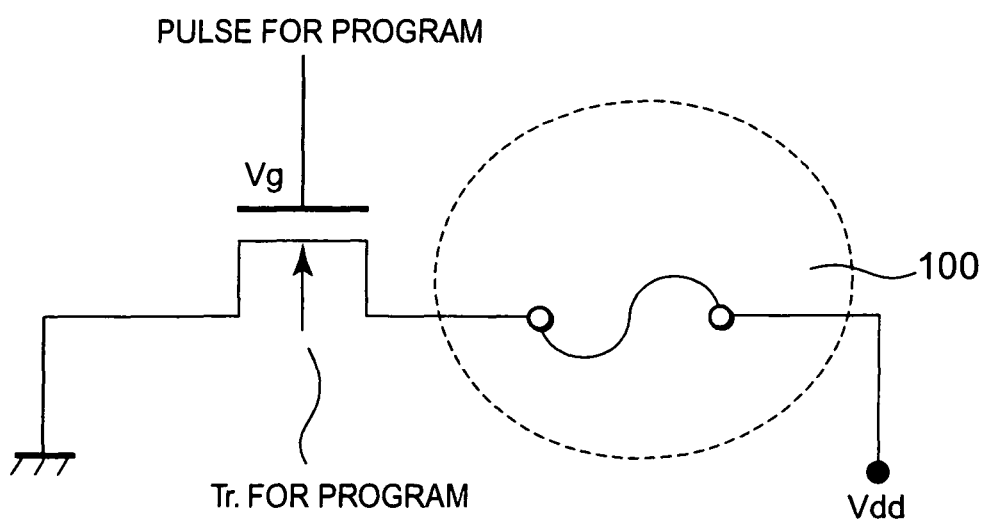
FIG. 10 is a schematic view illustrating a structure of the electrical fuse.

Next, a procedure for cutting the electrical fuse 100 according to this embodiment is described. A predetermined voltage is applied between the upper layer interconnect 110 and the lower layer interconnect 120 to apply appropriate power to the electrical fuse 100. The state of the above is illustrated in FIG. 10. Though there is no specific limitation, for example, high voltage (Vdd) is applied to the lower layer terminal 121 of the lower layer interconnect 120, and the upper layer terminal 111 of the upper layer interconnect 110 is grounded, whereby appropriate power is applied to the electrical fuse 100.

As a result, the electrical conductor forming the electrical fuse 100 expands. Along with the expansion of the electrical conductor, a crack occurs in an upper portion of the upper layer interconnect 110 having a large volume, and thus the electrical conductor forming the upper layer interconnect 110 flows upward into the interlayer insulating film 210 from the crack. Accordingly, a flowing-out portion is formed above the upper layer interconnect 110. Further, the electrical conductor migrates abruptly in a direction of the flowing-out portion, and thus the electrical conductor is cut at a point in which the migration of the electrical conductor has not kept up with migrated electrical conductor. In this embodiment, the electrical conductor is cut at a portion of the via 130 to form a void portion. In this embodiment, the guard upper layer interconnect 152 which functions as the heat sink is provided in the vicinity of the upper layer interconnect 110. For this reason, an excessive temperature rise of the upper layer interconnect 110 is suppressed, and hence generation of a crack in an unintended direction other than the upward direction may be avoided. As a result, even due to a thermal stress after the cut process, a path which goes around the cutting point and connects the upper layer interconnect 110 and the lower layer interconnect 120 is not formed, with the result that the electrical fuse 100 may sufficiently maintain high resistance.

As described above, according to the semiconductor device 200 according to this embodiment, the electrical fuse 100 is cut by the crack assist type process. Therefore, the cutting point may be made large, to thereby prevent the reconnection at the cutting point. Further, the conductive heat-absorbing member functioning as the heat sink, such as the guard upper layer interconnect 152, is provided in the vicinity of the electrical fuse 100, and thus the flowing-out portion of the electrical conductor forming the upper layer interconnect 110 may be controlled, and the short circuit may also be prevented from occurring in the electrical fuse 100 via the flowing-out electrical conductor. Accordingly, the electrical fuse having high reliability may be obtained.

Note that, for example, the fuse is cut with the use of the electromigration as described in JP 2006-253237 A, in order to efficiently cut the fuse, it is required to heat the cut portion of the fuse to induce the electromigration. The electrical fuse 100 according to this embodiment is cut by the crack assist type process, and hence the fuse does not need to be heated as described above. The inventor(s) of the present invention have revealed that the flowing-out portion may be controlled through control of the heat generated in the fuse.

EXAMPLE

In order to examine characteristics of the electrical fuse cut by the crack assist type process, experiments were conducted under extremely severe conditions.

Example 1

Figure 14:
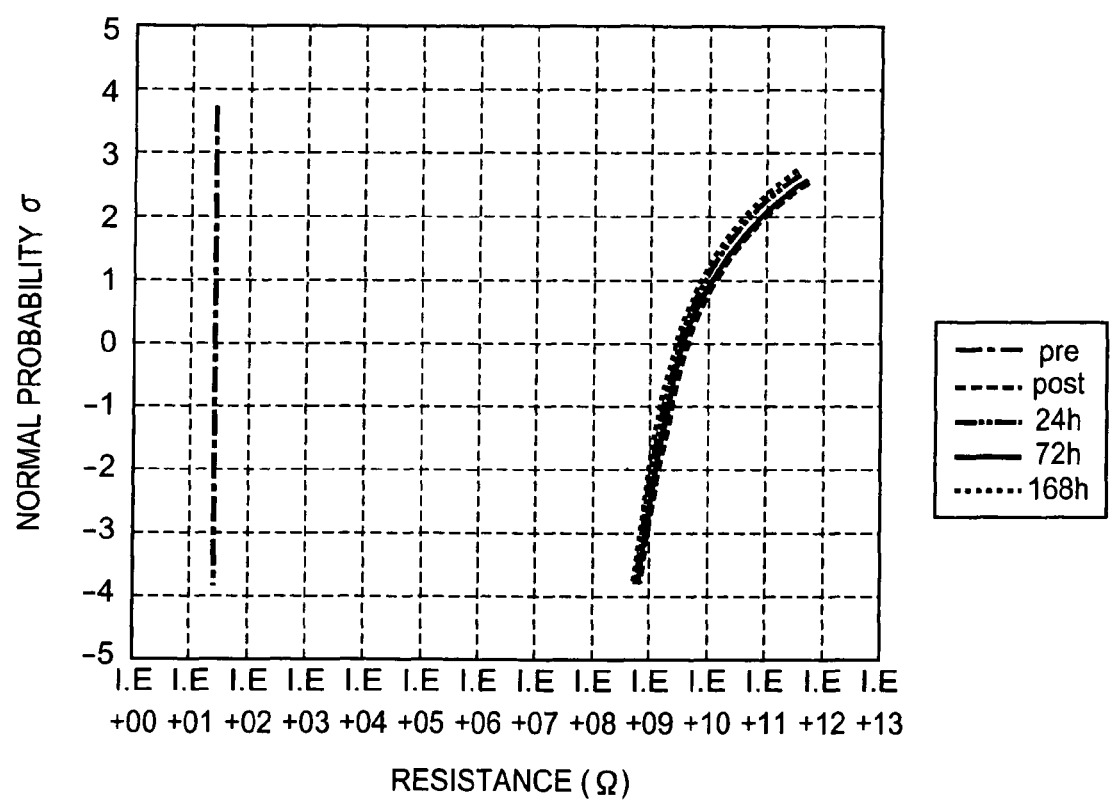
FIG. 14 is a graph illustrating experimental results.

The semiconductor device 200 having the above-mentioned structure was manufactured and cut by the crack assist type process. Then, resistance values of the electrical fuse included in the semiconductor device 200 were measured before cutting, immediately after cutting, after being left for 24 hours at 300° C., after being left for 72 hours at 300° C., and after being left for 168 hours at 300° C. In this case, the via diameter was set to 90 nm, and ((the distance S1 between the upper layer interconnect 110 and the guard upper layer interconnect 152)/the via diameter)=2. The measurement was performed on 9,000 electrical fuses. The results thereof are shown in FIG. 14. In FIG. 14, "pre", "post", "24 h", "72 h", and "168 h" represent before being cut, immediately after being cut, after a lapse of 24 hours, after a lapse of 72 hours, and after a lapse of 168 hours, respectively. A horizontal axis and a vertical axis of FIG. 14 indicate resistances and a normal probability, respectively. It was revealed from those results that the resistance of the electrical fuse after cutting does not vary even when a thermal stress has been applied at 300° C. for 168 hours.

Example 2

Figure 15:
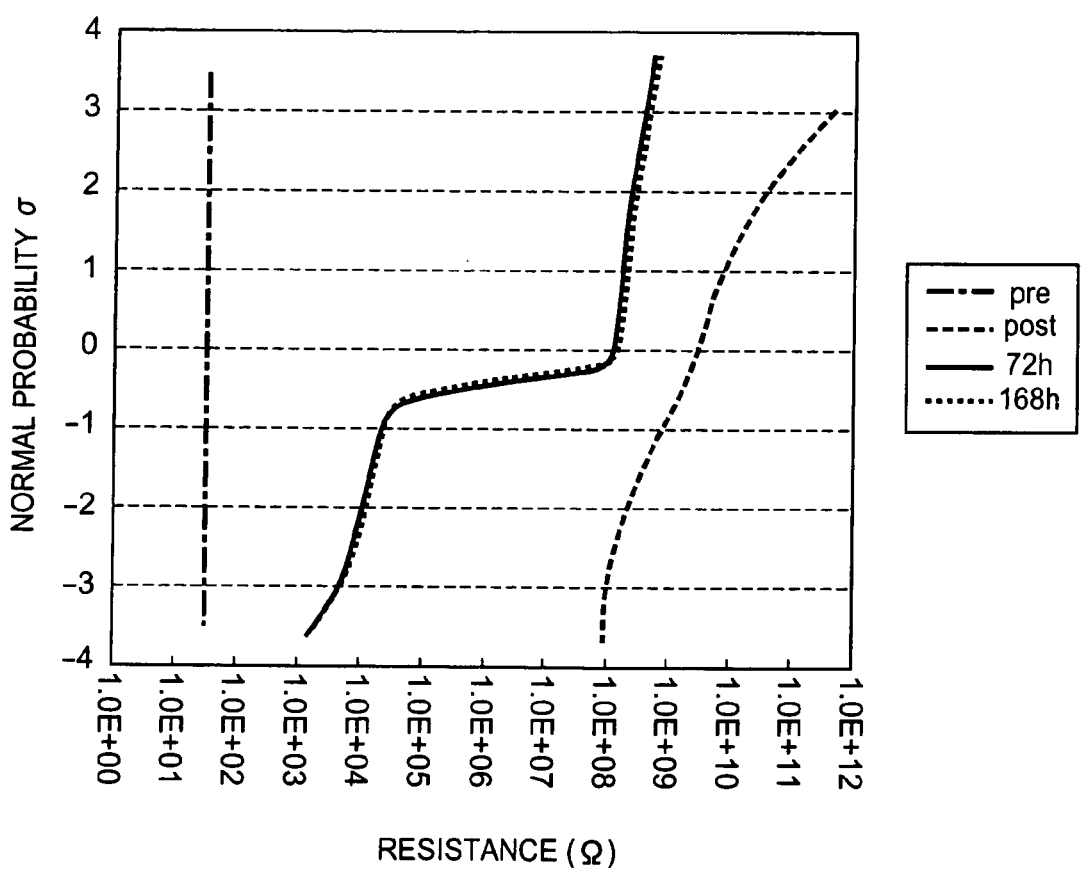
FIG. 15 is another graph illustrating the experimental results.

A semiconductor device having the similar structure as that of the semiconductor device 200 was manufactured providing ((the distance S1 between the upper layer interconnect 110 and the guard upper layer interconnect 152)/the via diameter) =6.5, and was cut by the crack assist type process. Then, resistance values of an electrical fuse included in the semiconductor device were measured before being cut, immediately after being cut, after being left for 24 hours at 300° C., after being left for 72 hours at 300° C., and after being left for 168 hours at 300° C. In this case, the via diameter was set to 90 nm, and the measurement was performed on 9,000 electrical fuses. The results thereof are shown in FIG. 15. In FIG. 15, "pre", "post", "72 h", and "168 h" represent before being cut, immediately after being cut, after a lapse of 72 hours, and after a lapse of 168 hours, respectively. It was revealed from those results that, if the electrical fuse whose resistance is reduced to less than 1 MΩ is determined as a defect, approximately 35% of the electrical fuses are regarded as a defect at the time when a thermal stress has been applied for 72 hours at 300° C. and a ratio (yield) at which a normal resistance has been maintained was 65%.

As illustrated in FIG. 14 and FIG. 15, with the structure of Example 2 in which the guard portion 150 is provided apart from the electrical fuse, all the electrical fuses exhibit high resistance immediately after being cut. However, there are some electrical fuses whose resistance has been significantly reduced after the lapse of 72 hours. On the other hand, with the structure of Example 1 in which the guard portion 150 is provided in the vicinity of the electrical fuse, the electrical fuses exhibit sufficiently high resistance immediately after being cut, and the resistance has hardly been reduced after the lapse of 168 hours. States of the electrical fuse 100 of Example 1 and Example 2 after being cut were checked by taking cross-sectional photographs thereof. Then, it was found in Example 2 that the electrical conductor has flowed below the upper layer interconnect 110 and the etch stop film 204 made of SiCN has been lost. Meanwhile, it was found in Example 1 that the etch stop film 204 has not been lost and the electrical conductor has not flowed below the upper layer interconnect 110.

Figure 16:
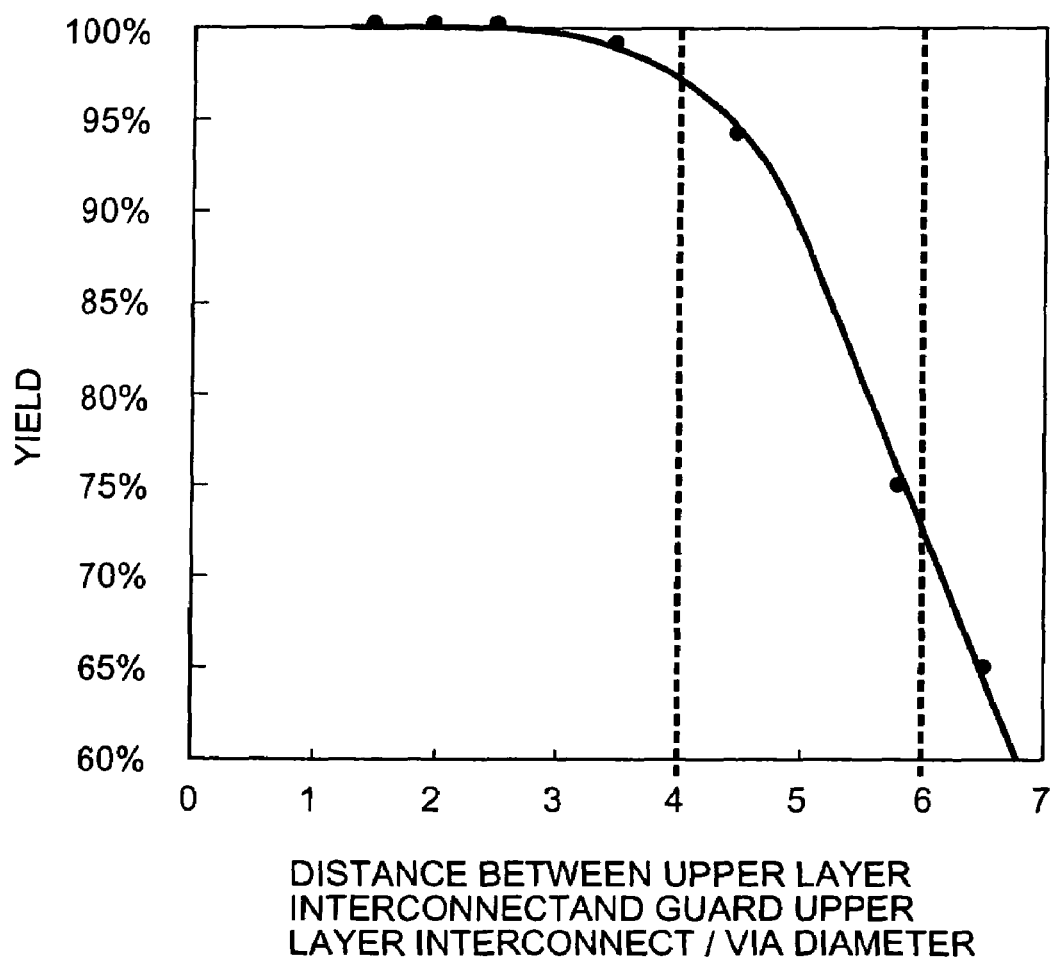
FIG. 16 is still another graph illustrating the experimental results.

FIG. 16 is a graph showing a relationship between ((the distance S1 between the upper layer interconnect 110 and the guard upper layer interconnect 152)/the via diameter) and the yield.

As shown in FIG. 16, the distance S1 is made to be equal to or smaller than six times the via diameter, whereby the yield may be made to be equal to or larger than 70%. Further, the distance S1 is made to be equal to or smaller than four times the via diameter, whereby the yield may be made to be equal to or larger than 98%. Note that also in Example 1 and Example 2 described above, designed values are used as a reference for sizes such as the via diameter and the distance between the upper layer interconnect and the guard upper layer interconnect.

The embodiment of the present invention has been described with reference to the drawings. However, the above is an exemplification of the present invention, and various structures other than the structure described above may also be adopted.

A case where the conductive heat-absorbing member is a part of the guard portion 150 has been described as an example in the embodiment above. However, it is sufficient that the conductive heat-absorbing member is provided in the vicinity of the upper layer interconnect 110 in at least the same layer as the upper layer interconnect 110. For example, the structure is made such that the guard lower layer interconnect 154 provided in the same layer as the lower layer interconnect 120 is not included.

Further, the example in which the guard upper layer interconnect 152, the guard lower layer via 153, and the guard lower layer interconnect 154 of the guard portion 150 are formed in the same shape in plan view has been described in the embodiment described above. However, the present invention is not limited thereto, and the upper layer and the lower layer may have shapes different from each other.

What is claimed is:
1. A semiconductor device, comprising:
   a substrate;
   an electrical fuse including:
      a lower Layer interconnect formed over the substrate;
      a via provided on the lower layer interconnect so as to be connected to the lower layer interconnect; and
      an upper layer interconnect provided on the via so as to be connected to the via;
      a first conductive heat-absorbing member and a second conductive heat-absorbing member which sandwich the lower layer interconnect the via and the upper layer interconnect,
   wherein a distance between the first conductive heat-absorbing member and the second conductive heat-absorbing member is shortened at a region in which the first conductive heat-absorbing member and the second conductive heat-absorbing member sandwich the upper layer interconnect.

2. A semiconductor device according to claim 1, wherein the electrical fuse includes a cutting point formed one of between the lower layer interconnect and the via and in the via.

3. A semiconductor device according to claim 1, wherein in the layer including the upper layer interconnect formed therein, a distance between the upper layer interconnect and the first conductive heat-absorbing member is equal to or smaller than six times a via diameter of the via.

4. A semiconductor device according to claim 1, wherein in the layer including the upper layer interconnect formed therein, a distance between the upper layer interconnect and the first conductive heat-absorbing member is equal to or smaller than four times a via diameter of the via.

5. A semiconductor device according to claim 1, wherein:
   the first conductive heat-absorbing member is also provided in each of a layer including the via formed therein and a layer including the lower layer interconnect formed therein so as to be formed continuously over the layer including the lower layer interconnect formed therein, the layer including the via formed therein, and the layer including the upper layer interconnect formed therein; and
   a distance between the upper layer interconnect and the first conductive heat-absorbing member formed in the layer including the upper layer interconnect formed therein is narrower than a distance between the lower layer interconnect and the first conductive heat-absorbing member formed in the layer including the lower layer interconnect formed therein.

6. A semiconductor device according to claim 1, wherein the electrical fuse is cut, in a state after being cut, through formation of a flowing-out portion the flowing-out portion being formed when an electrical conductor forming the upper layer interconnect flows outside the upper layer interconnect and the flowing-out portion is formed on the upper layer interconnect.

7. A semiconductor device according to claim 1, wherein the first conductive heat-absorbing member is formed so as to absorb the heat generated in the upper layer interconnect to prevent the electrical conductor forming the upper layer interconnect from flowing below the upper layer interconnect.

8. A semiconductor device according to claim 1, wherein the upper layer interconnect of the electrical fuse has a larger volume than the lower layer interconnect thereof.

9. A semiconductor device according to claim 1, wherein the first conductive heat-absorbing member is provided in parallel with the upper layer interconnect.

10. A semiconductor device according to claim 1, wherein side surfaces and bottom surfaces of the lower layer interconnect, the via or the upper layer interconnect are provided with a barrier metal film.

11. A semiconductor device according to claim 1, wherein an expansion amount of the upper layer interconnect is greater than an expansion amount of the lower layer interconnect to cause flowing-out of an electrical conductor in the upper layer interconnect.

12. A semiconductor device according to claim 1, wherein a length of the upper layer interconnect is greater than a length of the lower layer interconnect.

13. A semiconductor device according to claim 1, wherein the upper layer interconnect is connected to an upper layer terminal formed in the same layer as the upper layer interconnect, and the lower layer interconnect is connected to a lower layer terminal formed in the same layer as the lower layer interconnect.

14. A semiconductor device according to claim 13, wherein the upper layer terminal comprises a same material as the upper layer interconnect and the lower layer terminal comprises a same material as the lower layer interconnect.

15. A semiconductor device according to claim 14, wherein the electrical fuse comprises an interlayer insulating film and the lower layer interconnect is provided in the interlayer insulating film.

16. A semiconductor device according to claim 14, wherein the electrical fuse comprises an interlayer insulating film and the upper layer interconnect is provided in the interlayer insulating film.

\* \* \* \* \*